US008685776B2

(12) United States Patent
LaFond et al.

(10) Patent No.: US 8,685,776 B2
(45) Date of Patent: Apr. 1, 2014

(54) WAFER LEVEL PACKAGED MEMS DEVICE

(75) Inventors: Peter H. LaFond, Morristown, NJ (US); Lianzhong Yu, Morristown, NJ (US)

(73) Assignee: Honeywell International Inc., Morristown, NJ (US)

( * ) Notice: Subject to any disclaimer, the term of this patent is extended or adjusted under 35 U.S.C. 154(b) by 209 days.

(21) Appl. No.: 12/965,569

(22) Filed: Dec. 10, 2010

(65) Prior Publication Data

US 2011/0092018 A1    Apr. 21, 2011

Related U.S. Application Data

(63) Continuation of application No. 11/864,725, filed on Sep. 28, 2007, now abandoned.

(51) Int. Cl.
*H01L 41/00* (2013.01)
*A01B 1/02* (2006.01)

(52) U.S. Cl.
CPC .. *A01B 1/02* (2013.01); *A01B 1/026* (2013.01)
USPC ................. 438/48; 438/50; 257/416

(58) Field of Classification Search
USPC .............. 438/48–53; 257/414, 415, 416, 417, 257/418, 419, 420; 29/594, 831, 846, 847; 333/197, 198, 199
See application file for complete search history.

(56) References Cited

U.S. PATENT DOCUMENTS

| 6,423,563 | B2 | 7/2002 | Fukada |
| 6,552,404 | B1 * | 4/2003 | Hynes et al. .................. 257/415 |
| 6,718,824 | B2 | 4/2004 | Ito |
| 6,789,423 | B2 | 9/2004 | An et al. |
| 6,892,575 | B2 * | 5/2005 | Nasiri et al. ................ 73/504.12 |
| 7,416,910 | B2 * | 8/2008 | Foote et al. ..................... 438/48 |

(Continued)

FOREIGN PATENT DOCUMENTS

| JP | 2006-147864 A | 6/2006 |
| WO | 2005/045885 A2 | 5/2005 |
| WO | 2006/078564 A1 | 7/2006 |

OTHER PUBLICATIONS

Translation of Office Action from the counterpart Japanese application No. 2010-527259, dated Jul. 19, 2013. 2 pages.

(Continued)

*Primary Examiner* — Cuong Q Nguyen
*Assistant Examiner* — Yosef Gebreyesus
(74) *Attorney, Agent, or Firm* — Shumaker & Sieffert, P.A.

(57) ABSTRACT

An apparatus and method for sensor architecture based on bulk machining of silicon wafers and fusion bond joining which provides a nearly all-silicon, hermetically sealed, microelectromechanical system (MEMS) device. An example device includes a device sensor mechanism formed in an active semiconductor layer and separated from a handle layer by a dielectric layer, and a silicon cover plate having a handle layer with a dielectric layer being bonded to portions of the active layer. Pit are included in one of the handle layers and corresponding dielectric layers to access electrical leads on the active layer. Another example includes set backs from the active components formed by anisotropically etching the handle layer while the active layer has been protectively doped.

8 Claims, 5 Drawing Sheets

(56) References Cited

U.S. PATENT DOCUMENTS

| | | | |
|---|---|---|---|
| 2002/0014673 A1* | 2/2002 | Leedy | 257/419 |
| 2005/0037534 A1* | 2/2005 | Sawyer | 438/84 |
| 2005/0179099 A1* | 8/2005 | Lutz et al. | 257/414 |
| 2005/0205951 A1* | 9/2005 | Eskridge | 257/416 |
| 2006/0123927 A1* | 6/2006 | Foote et al. | 73/862.639 |
| 2006/0128048 A1* | 6/2006 | Foote et al. | 438/50 |
| 2006/0163679 A1* | 7/2006 | LaFond et al. | 257/414 |
| 2006/0163680 A1* | 7/2006 | Chen | 257/416 |
| 2006/0207087 A1* | 9/2006 | Jafri et al. | 29/831 |
| 2007/0218585 A1 | 9/2007 | Robert | |
| 2008/0099862 A1 | 5/2008 | Fujii et al. | |
| 2009/0025477 A1* | 1/2009 | Pilchowski et al. | 73/514.15 |

OTHER PUBLICATIONS

Translation of Office Action from the counterpart Japanese application No. 2010-527259, dated Mar. 13, 2013. 1 page.

Notification of Transmittal of the International Search Report and the Written Opinion from counterpart International application No. PCT/US2008/080691, dated Jul. 14, 2009. 10 pages.

International Preliminary Report on Patentability from counterpart International application No. PCT/US2008/080691, dated Mar. 30, 2010. 5 pages.

Decision of Rejection and Translation of Decision of Rejection from the counterpart Japanese application No. 2010-527259, dated Dec. 10, 2013, 4 pages.

\* cited by examiner

WAFER LEVEL PACKAGED MEMS DEVICE

PRIORITY INFORMATION

This application is a Continuation of application Ser. No. 11/864,725 filed Sep. 28, 2007 and is hereby incorporated by reference.

BACKGROUND OF THE INVENTION

Microelectromechanical systems or "MEMS" devices are generally well-known. In the most general form, MEMS devices consist of mechanical microstructures, microsensors, microactuators and electronics integrated in the same environment, i.e., on a silicon chip. MEMS technology is an enabling technology in the field of solid-state transducers, i.e., sensors and actuators. The microfabrication technology enables fabrication of large arrays of devices, which individually perform simple tasks but in combination can accomplish complicated functions. Current applications include accelerometers, pressure, chemical and flow sensors, micro-optics, optical scanners, and fluid pumps. For example, one micromachining technique involves masking a body of silicon in a desired pattern, and then deep etching the silicon to remove unmasked portions thereof. The resulting three-dimensional silicon structure functions as a miniature mechanical force sensing device, such as an accelerometer that includes a proof mass suspended by a flexure.

What is needed are methods and devices that are simpler and more cost-effective, while still adhering as closely as possible to "best practice" design principles.

SUMMARY OF THE INVENTION

The present invention provides an apparatus and method for sensor architecture based on bulk machining of Silicon-On-Oxide (SOI) and Double-Sided Polished (DSP) wafers and fusion bond joining that simplifies manufacturing and reduces costs by providing a nearly all-silicon, hermetically sealed, microelectromechanical system (MEMS) device, such as an electrostatic accelerometer or rate gyro device.

In one aspect of the present invention, the device includes a device sensor mechanism formed in an active semiconductor layer separated from a handle layer by a dielectric layer, and a first silicon cover plate having a relatively thicker handle portion with a thin dielectric layer. The dielectric layer of the cover plate is bonded to an active layer face of the device sensor mechanism. Cavities are formed in one or both of the handle layers and corresponding dielectric layer to expose electrical leads.

In another aspect of the present invention, the cover is an SOI wafer and set backs from the active components are anisotropically etched into the handle layer while the active layer has been protectively doped.

BRIEF DESCRIPTION OF THE DRAWINGS

Preferred and alternative embodiments of the present invention are described in detail below with reference to the following drawings.

DETAILED DESCRIPTION OF THE PREFERRED EMBODIMENT

Figure 1:
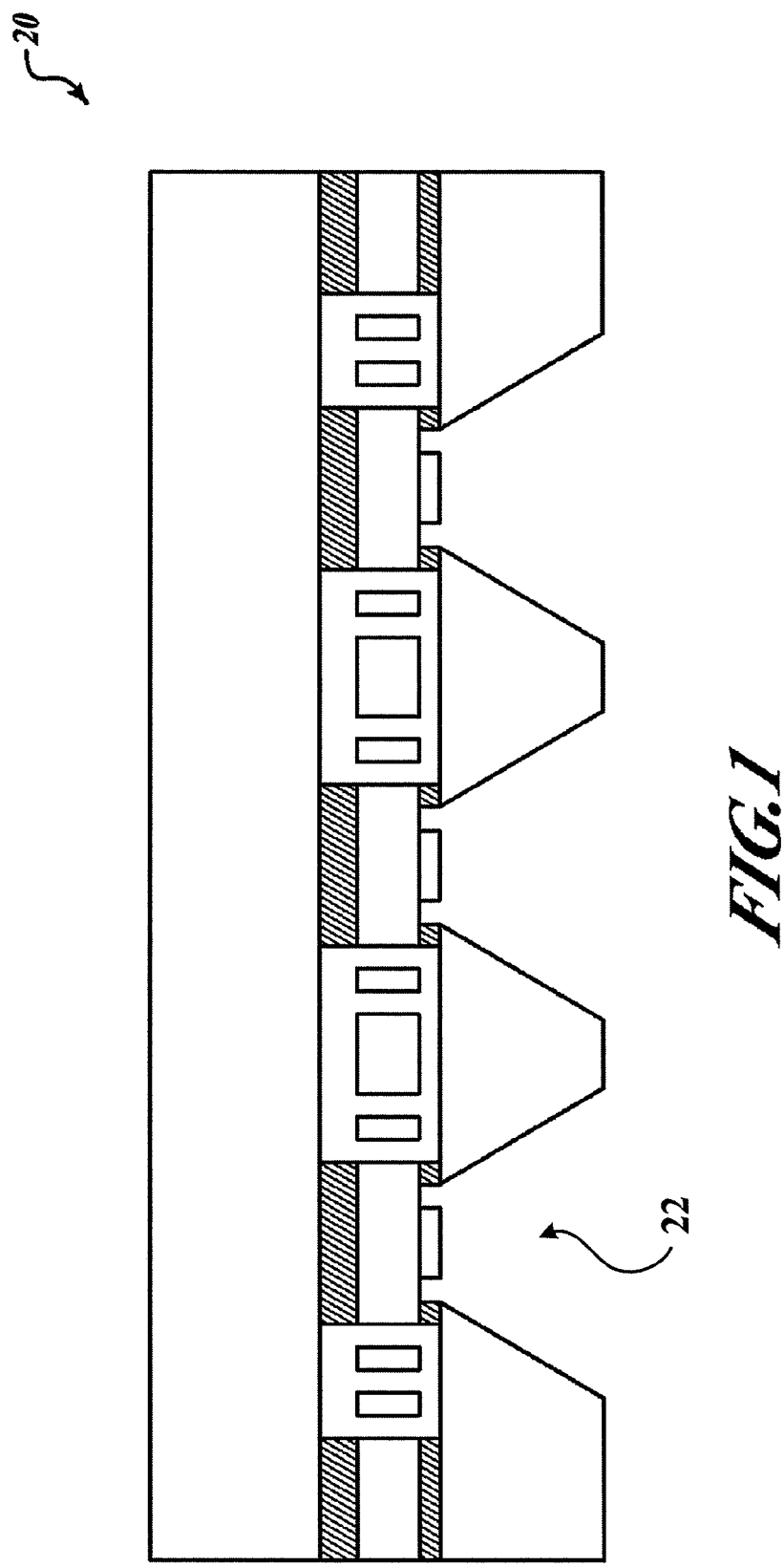
FIG. 1 is a cross-sectional view of a sensor mechanism device formed in accordance with an embodiment of the present invention.

FIGS. 1, 2A-E illustrate a sensor mechanism device 20 and process for making same. A first silicon-on-insulator (SOI) wafer 30 has a mechanism layer 34 on a dielectric (e.g., $SiO_2$) layer 36 which is on a handle layer (Si) 32. The dielectric layer 36 has a thickness from about 0.5 to 3.0 microns that is sandwiched between the handle layer 32 and the mechanism layer 34. The dielectric layer 36 is oxide or some other insulator.

Figure 2A:
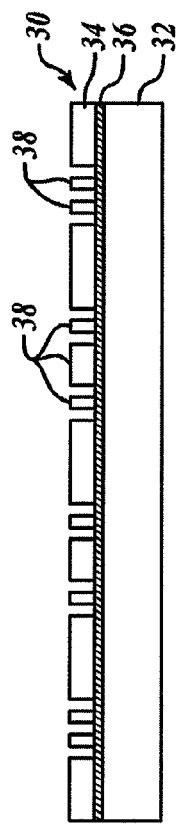
FIGS. 2A-E illustrate a fabrication process for creating a sensor mechanism device.
Figure 2B:
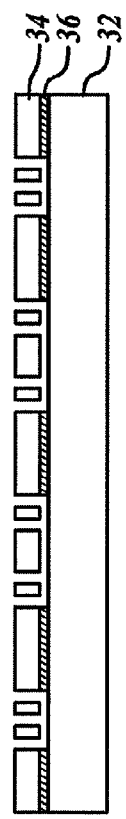

First, as shown in FIG. 2A, the mechanism layer 34 is etched using a known etchant (e.g., RIE (Reactive Ion Etch) or DRIE (Deep Reactive Ion Etch)) according to a predefined etching pattern(s). The dielectric layer 36 acts as an etch stop. Etching exposes appropriate actuator and/or sensor mechanical features (e.g. 38) in the mechanism layer 34. Next as shown in FIG. 2B, hydrogen fluoride (HF) etching and/or carbon dioxide ($CO_2$) is used to etch away the dielectric below and around the features 38. Other etchants may be used provided the handle layer 32 acts as an etch stop.

Figure 2C:
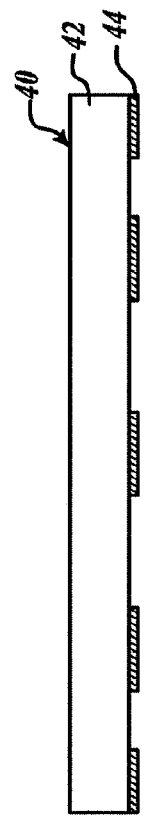

FIG. 2C is a cross-sectional view that illustrates fabrication of a silicon cover 40 from a double sided polished (DSP) wafer. The cover 40 includes a dielectric layer 44 on one side of a handle layer 42. The dielectric layer 44 is etched to expose a pattern of cooperating interior cover plate features that correspond to the location of the etched features 38. The dielectric layer 44 is etched using known etching techniques (see above) with the handle layer 42 being an etch stop.

Figure 2D:
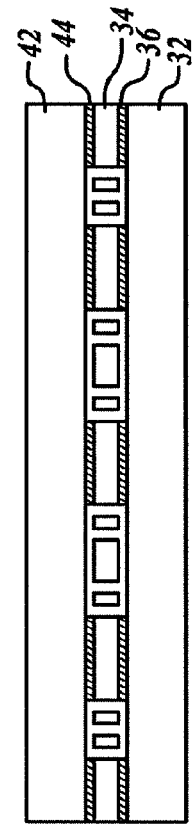
Figure 2E:
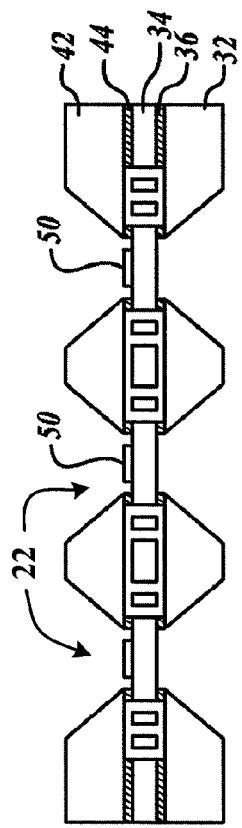
Figure 3:
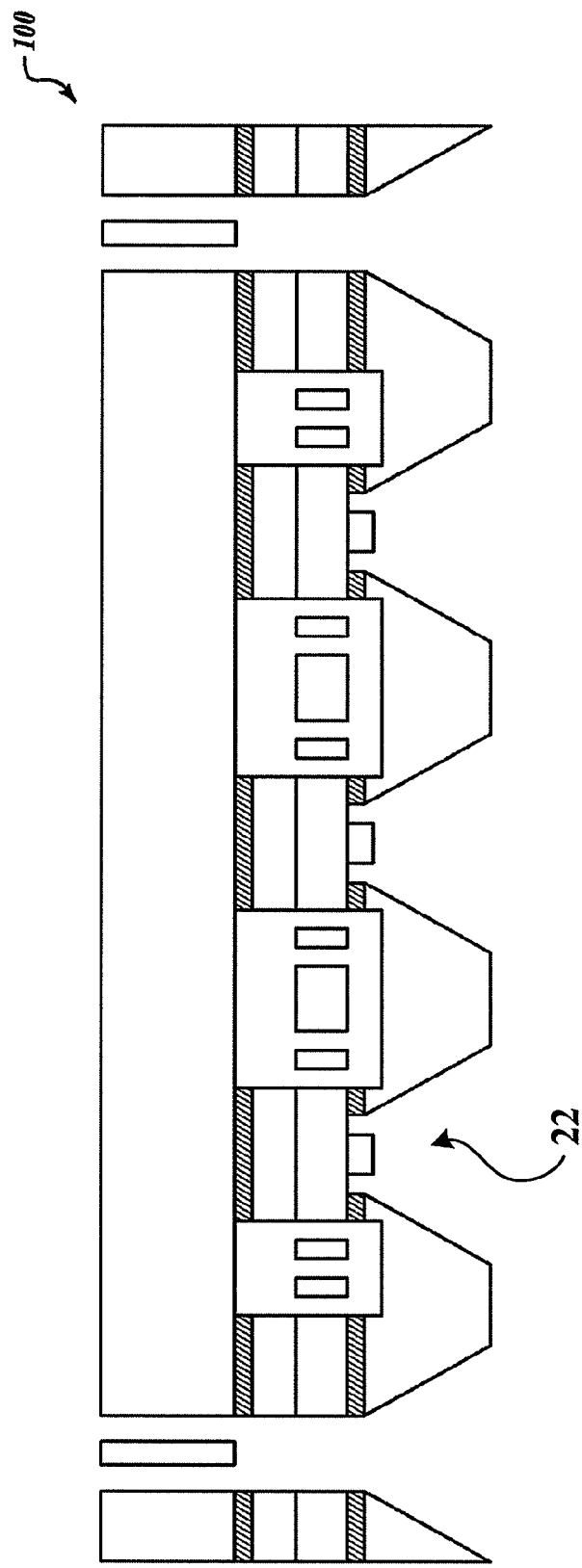
FIG. 3 is a cross-sectional view of another sensor mechanism device formed in accordance with an embodiment of the present invention.

Next, at a FIG. 2D, the silicon cover 40 is fusion or Au-eutectic bonded to the SOI wafer 30. The remaining portions of the dielectric layer 44 are bonded to non-feature components of the mechanical layer 34. Next, as shown in FIG. 2E, one or both of the handle layers 32 and 42 are etched away at locations relative to some of the non-feature portions of the mechanism layer 34 using a conventional wet etching process, such as potassium hydroxide (KOH). Next, one or both of the exposed dielectric material from the dielectric layers 36 and 44 are then etched away, using a standard etching process, to expose a portion of the non-featured portion of the mechanism layer 34. Next, metalized connectors 50 of a suitable metallization are applied to portions of the exposed non-featured sections of the mechanism layer 34. The metalized connectors 50 provide electrical connections to exposed electrical traces on the mechanism layer 34 that are in electrical communication with the active internal components (features 38). Lastly, dicing (not shown) occurs in order to separate sealed functional components and associated externally exposed metalized connectors 50.

Figure 4A:
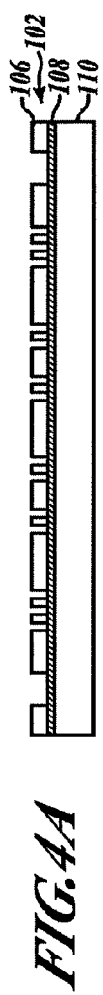
FIGS. 4A-G illustrate a fabrication process for creating the device of FIG. 3.
Figure 4B:
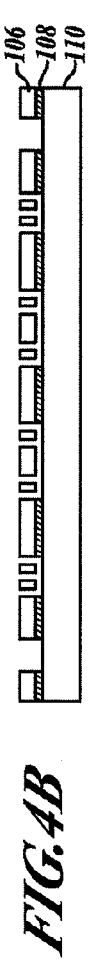
Figure 4C:
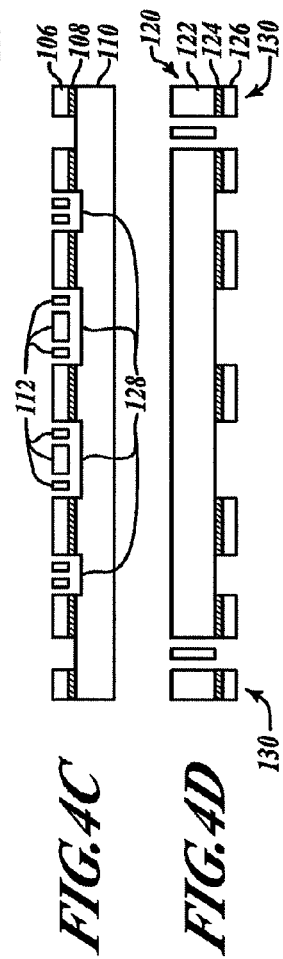
Figure 4D:
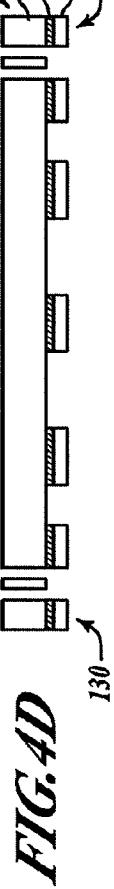
Figure 4E:
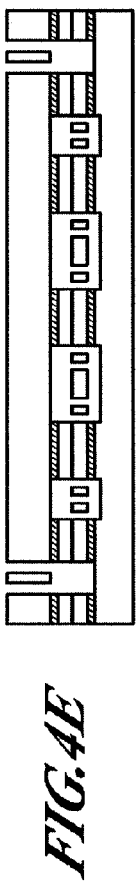
Figure 4F:
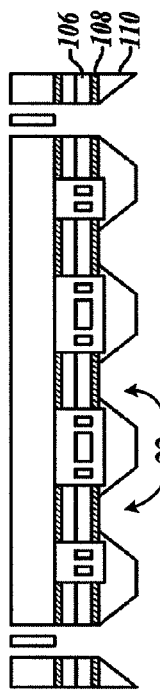
Figure 4G:
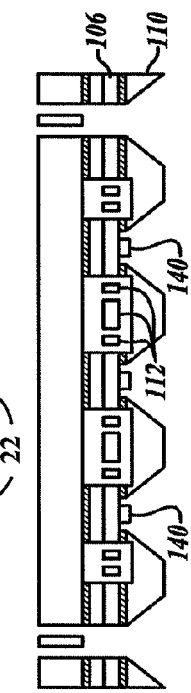

Next, at FIG. 4D, the cover 120 is etched to expose a handle layer 122 at positions that would correspond to the active components 112 from the base wafer 102. Then, an optional mechanical isolation peripheral device 130, such as an isloator flange or isolation flange, is etched using DRIE or comparable etching technique. Next, at FIG. 4E, the cover 120 is attached to the base wafer 102 using a fusion bond, Au-eutectic bond, or comparable type of bonding process. Next, at FIG. 4F, a KOH etch or comparable etching technique is used to etch away a handle layer 110 of the base wafer 102 and the handle layer 122 is etched by DRIE process in order to complete the mechanical isolation around the periphery and to expose portions of a dielectric layer 124. The mechanical isolation around the periphery reduces the amount of mechanical loads that can impinge upon the components 112 when they are in a package. Then, the exposed dielectric material in the dielectric layer 124 is etched to form pit features 22 that expose the surface of the mechanism layer 106. Metalized contacts 140 are then applied to the exposed surface of the mechanism layer 106 in order to allow for connection of the active components 112 within corresponding hermetically sealed cavities to external devices (not shown). Dicing (not shown) of the entire package is then performed.

Figure 5:
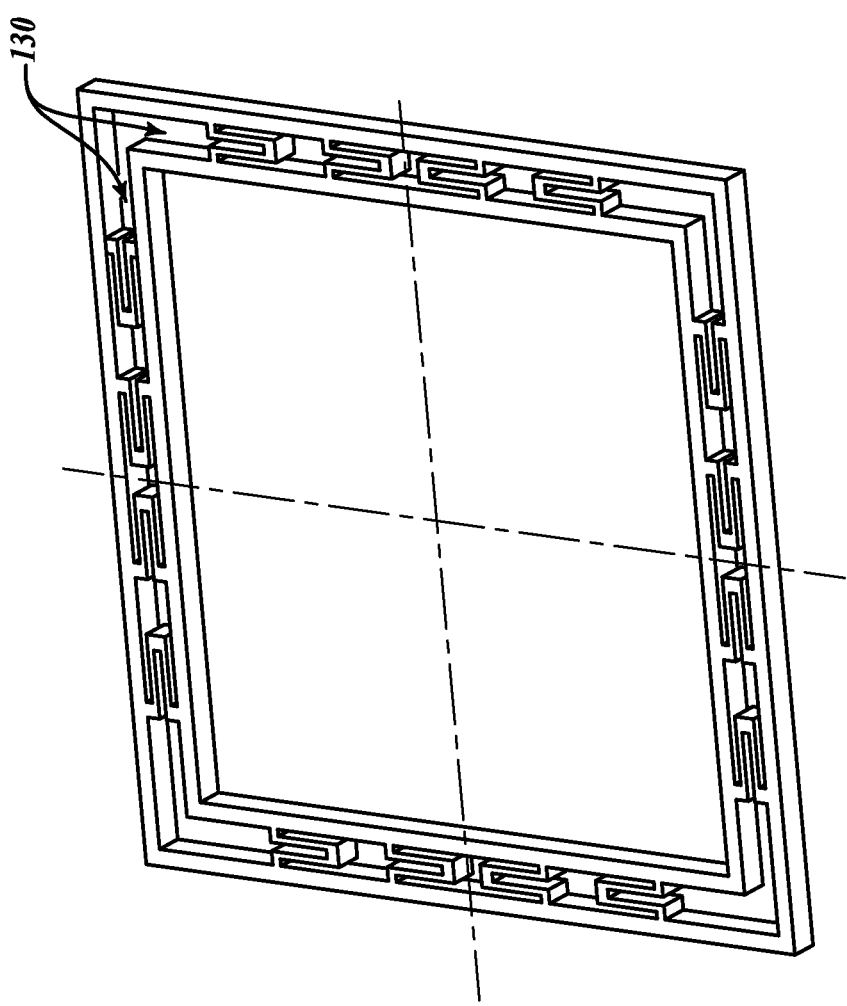
FIG. 5 is a perspective view of an isolator flange of the present invention.

FIG. 5 is a perspective view of an isolator flange 130 of the present invention. At least one isolator flange 130 is formed by selectively etching the base section and the cover plate at an exterior edge of the device.

While the preferred embodiment of the invention has been illustrated and described, as noted above, many changes can be made without departing from the spirit and scope of the invention. For example, steps described and claimed may be performed in a different order without departing from the spirit and scope of the invention—e.g., doping of the active layer may be performed before etching the same layer. Accordingly, the scope of the invention is not limited by the disclosure of the preferred embodiment. Instead, the invention should be determined entirely by reference to the claims that follow.

The embodiments of the invention in which an exclusive property or privilege is claimed are defined as follows:

1. A method for forming a wafer level package device from only a base silicon-on-insulator (SOI) wafer and a cover plate wafer, the method comprising:
    etching at least one active component in an active layer of the base SOI wafer, the SOI wafer having a handle layer separated from the active layer by a dielectric layer;
    etching the dielectric layer in the vicinity of the formed at least one active component after etching of the at least one active component;
    etching a dielectric layer of the cover plate wafer to form cavities to coincide with the at least one active component, the cover plate wafer having a handle layer attached to the cover plate wafer dielectric layer;
    bonding the dielectric layer of a cover plate wafer to non-active components of the active layer;
    etching at least one of the handle layers and corresponding dielectric layer to expose a portion of a surface of the active layer; and
    forming a metallization on a portion of the exposed surface of the active layer,
    wherein the at least one active component is included within a cavity,
    thus the wafer level package device is formed from at most two SOI wafers.

2. The method of claim 1, further comprising etching at least one isolator flange into the base wafer and the cover plate wafer at an exterior edge.

3. The method of claim 1, wherein the cavity is a hermetically sealed cavity.

4. The method of claim 3, wherein the cavity is defined by the handle layers on two sides and the active layer and the dielectric layers on all other sides.

5. A method for forming a wafer level package device from only two silicon-on-insulator (SOI) wafers, the method comprising:
    forming at least one active component in an active layer of a base SOI wafer of the two SOI wafers, wherein the base SOI wafer comprises the active layer, a dielectric layer and a handle layer;
    applying a dopant to the active layer;
    anisotropically etching the handle layer of the base SOI wafer in the vicinity of the at least one active component;
    etching an active layer and a dielectric layer of a cover plate SOI wafer of the two SOI wafers to form one or more cavities to coincide with the at least one active component of the base SOI wafer;
    bonding the base SOI wafer to the cover plate SOI wafer;
    etching at least one of the handle layers and corresponding dielectric layer to expose a surface of the corresponding active layer from the base SOI wafer or from the cover plate SOI wafer; and
    forming a metallization on at least a portion of the exposed active layer,
    wherein the at least one active component is included within a cavity,
    thus the wafer level package device is formed from at most two SOI wafers.

6. The method of claim 5, further comprising etching at least one of the SOI wafers in order to form one or more isolation flanges.

7. The method of claim 5, wherein the cavity is a hermetically sealed cavity.

8. The method of claim 7, wherein the cavity is defined by the handle layers on two sides and the active layer and the dielectric layers on all other sides.

* * * * *